US009786239B2

(12) United States Patent
Cao

(10) Patent No.: US 9,786,239 B2
(45) Date of Patent: Oct. 10, 2017

(54) GOA CIRCUIT BASED ON P-TYPE THIN FILM TRANSISTORS

(71) Applicant: Shenzhen China Star Optoelectronics Technology Co., Ltd., Shenzhen (CN)

(72) Inventor: Shangcao Cao, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 78 days.

(21) Appl. No.: 14/770,824

(22) PCT Filed: May 20, 2015

(86) PCT No.: PCT/CN2015/079377
§ 371 (c)(1),
(2) Date: Aug. 27, 2015

(87) PCT Pub. No.: WO2016/161694
PCT Pub. Date: Oct. 13, 2016

(65) Prior Publication Data
US 2017/0047031 A1  Feb. 16, 2017

(30) Foreign Application Priority Data

Apr. 7, 2015  (CN) .......................... 2015 1 0160939

(51) Int. Cl.
*G09G 3/36* (2006.01)
*G02F 1/1362* (2006.01)
(Continued)

(52) U.S. Cl.
CPC ......... *G09G 3/3677* (2013.01); *G02F 1/1368* (2013.01); *G02F 1/136286* (2013.01);
(Continued)

(58) Field of Classification Search
CPC ...... G09G 3/36; G09G 3/3625; G09G 3/3648; G09G 3/3674; G09G 3/3677; G09G 3/3681; G09G 3/3696
(Continued)

(56) References Cited

U.S. PATENT DOCUMENTS

2015/0294636 A1* 10/2015 Yu .......................... G09G 3/3655
345/204
2016/0140922 A1* 5/2016 Dai ....................... G11C 19/287
345/92

(Continued)

*Primary Examiner* — Alexander Eisen
*Assistant Examiner* — Nelson Lam
(74) *Attorney, Agent, or Firm* — Leong C. Lei

(57) ABSTRACT

The present invention provides a GOA circuit based on P-type thin film transistor, comprising a plurality of GOA unit circuits which are cascade connected, and the GOA unit circuit of every stage comprises a forward-backward scan module (100), an output module (200), a pull-down holding module (300) and a pull-down module (400); the GOA unit circuit of the nth stage and the GOA unit circuit of the n+1th stage adjacent thereto are one cycle; the forward-backward scan module (100) employs the first high frequency clock signal (LCK) and the first backward high frequency clock signal (XLCK) to control the forward-backward scan of the P-type thin film transistor. The GOA circuit based on P-type thin film transistor can ease the deterioration of the thin film transistors in the forward-backward scan module, and reduce the circuit power consumption to decrease the number of the signal lines and realize the narrow frame design. Moreover, it can promote the stability of the GOA circuit and ensure the smooth output of the scan signal (G(n)).

18 Claims, 9 Drawing Sheets

(51) Int. Cl.
*G02F 1/1368* (2006.01)
*H01L 27/12* (2006.01)
*G11C 19/28* (2006.01)
*G11C 19/18* (2006.01)

(52) U.S. Cl.
CPC ............ *G11C 19/184* (2013.01); *G11C 19/28* (2013.01); *H01L 27/124* (2013.01); *H01L 27/1222* (2013.01); *H01L 27/1255* (2013.01); *G09G 2310/0283* (2013.01); *G09G 2310/0286* (2013.01); *G09G 2310/08* (2013.01); *G09G 2330/021* (2013.01)

(58) Field of Classification Search
USPC .................................................. 345/87–104
See application file for complete search history.

(56) References Cited

U.S. PATENT DOCUMENTS

| | | | |
|---|---|---|---|
| 2016/0140926 A1* | 5/2016 | Xiao | G09G 3/3677 345/215 |
| 2016/0140928 A1* | 5/2016 | Xiao | G09G 3/3648 345/212 |
| 2016/0148589 A1* | 5/2016 | Cao | G09G 3/3677 345/208 |
| 2016/0171949 A1* | 6/2016 | Dai | G09G 3/3677 345/212 |
| 2016/0180788 A1* | 6/2016 | Xiao | G09G 3/3677 345/204 |
| 2016/0189584 A1* | 6/2016 | Xiao | G09G 3/20 345/55 |
| 2016/0189647 A1* | 6/2016 | Xiao | G11C 19/28 345/92 |
| 2016/0189648 A1* | 6/2016 | Xiao | G09G 3/3677 345/212 |
| 2016/0343323 A1* | 11/2016 | Xiao | G09G 3/3648 |
| 2017/0140728 A1* | 5/2017 | Zhao | G09G 3/3677 |
| 2017/0162149 A1* | 6/2017 | Zhao | G09G 3/3677 |

* cited by examiner

GOA CIRCUIT BASED ON P-TYPE THIN FILM TRANSISTORS

FIELD OF THE INVENTION

The present invention relates to a display technology field, and more particularly to a GOA circuit based on P-type thin film transistor.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

In the active liquid crystal display, each pixel is electrically coupled to a thin film transistor (TFT), and the gate thereof is coupled to a level scan line, and the drain is coupled to a vertical data line, and the source is coupled to the pixel electrode. The enough voltage is applied to the level scan line, and all the TFTs electrically coupled to the horizontal scan line are activated. Thus, the signal voltage on the data line can be written into the pixel to control the transmittances of different liquid crystals to achieve the effect of controlling colors and brightness. The driving of the level scan line in the present active liquid crystal display is mainly accomplished by the external Integrated Circuit (IC). The external IC can control the charge and discharge stage by stage of the level scan lines of respective stages. The GOA technology, i.e. the Gate Driver on Array technology can utilize the original manufacture processes of the liquid crystal display panel to manufacture the driving circuit of the level scan lines on the substrate around the active area, to replace the external IC for accomplishing the driving of the level scan lines. The GOA technology can reduce the bonding procedure of the external IC and has potential to raise the productivity and lower the production cost. Meanwhile, it can make the liquid crystal display panel more suitable to the narrow frame or non frame design of display products.

Generally, the GOA circuits may have the GOA circuit based on P-type thin film transistor, the GOA circuit based on CMOS and the GOA circuit based on N-type thin film transistor. The GOA circuit based on P-type thin film transistor, and particularly the GOA circuit based on P-type thin film transistor which the Low Temperature Poly-silicon (LTPS) is the material has properties of simpler art, low electrical leakage, and the development prospect is great. However, the GOA circuit based on P-type thin film transistor according to prior art often has worse stability and the power consumption is higher.

SUMMARY OF THE INVENTION

An objective of the present invention is to provide a GOA circuit based on P-type thin film transistor can ease the deterioration of the thin film transistors in the forward-backward scan module, and reduce the circuit power consumption to decrease the number of the signal lines and realize the narrow frame design, and meanwhile to promote the stability of the GOA circuit.

For realizing the aforesaid objective, the present invention provides a GOA circuit based on P-type thin film transistor, comprising a plurality of GOA unit circuits which are cascade connected, and the GOA unit circuit of every stage comprises a forward-backward scan module, an output module, a pull-down holding module and a pull-down module; n is set to be a positive integer, and the GOA unit circuit of the nth stage and the GOA unit circuit of the n+1th stage adjacent thereto are one cycle;

except the GOA unit circuit of the first and last stages, in the GOA unit circuit of the nth stage:

the forward-backward scan module comprises: a first P-type thin film transistor, and a gate of the first P-type thin film transistor is electrically coupled to a first high frequency clock signal, and a source is electrically coupled to a stage transfer signal of the GOA unit circuit of the former n−1th stage, and a drain is electrically coupled to a first node; a second P-type thin film transistor, and a gate of the second P-type thin film transistor is electrically coupled to a first backward high frequency clock signal, and a source is electrically coupled to a stage transfer signal of the GOA unit circuit of the latter n+1th stage, and a drain is electrically coupled to the first node;

the output module comprises: a third P-type thin film transistor, and a gate of the third P-type thin film transistor is electrically coupled to the first node, and a source is electrically coupled to a second node, and a drain is electrically coupled to a constant low voltage level and a gate of a fourth P-type thin film transistor; the fourth P-type thin film transistor, and a gate of the fourth P-type thin film transistor is electrically coupled to the constant low voltage level and the drain of the third P-type thin film transistor, and a source is electrically coupled to the second node, and a drain is electrically coupled to a third node; a fifth P-type thin film transistor, and a gate of the fifth P-type thin film transistor is electrically coupled to a third node, and a source is electrically coupled to a second high frequency clock signal, and a drain is electrically coupled to the stage transfer signal; a fifteenth P-type thin film transistor, and a gate of the fifteenth P-type thin film transistor is electrically coupled to the third node, and a source is electrically coupled to the second high frequency clock signal, and a drain is electrically coupled to a scan signal; a first capacitor, and one end of the first capacitor is electrically coupled to the second node, and the other end is electrically coupled to a constant high voltage level;

the pull-down holding module comprises: an eleventh P-type thin film transistor, and a gate of the eleventh P-type thin film transistor is electrically coupled to a fourth node, and a source is electrically coupled to the second node, and a drain is electrically coupled to the constant high voltage level; a seventh P-type thin film transistor, and a gate of the seventh P-type thin film transistor is electrically coupled to the fourth node, and a source is electrically coupled to the stage transfer signal, and a drain is electrically coupled to the constant high voltage level; an eighth P-type thin film transistor, and a gate of the eighth P-type thin film transistor is electrically coupled to the fourth node, and a source is electrically coupled to the scan signal, and a drain is electrically coupled to the constant high voltage level;

the pull-down module comprises: a tenth P-type thin film transistor, and a gate of the tenth P-type thin film transistor is electrically coupled to the first node, and a source is electrically coupled to a gate of a thirteenth P-type thin film transistor, and a drain is electrically coupled to the constant high voltage level; a ninth P-type thin film transistor, and a gate of the ninth P-type thin film transistor is electrically coupled to the first node, and a source is electrically coupled to the fourth node, and a drain is electrically coupled to the constant high voltage level;

the GOA unit circuit of the nth stage further comprises: a fourteenth P-type thin film transistor, and both a gate and a source of the fourteenth P-type thin film transistor are electrically coupled to the second high frequency clock signal, and a drain is electrically coupled to one end of a second capacitor and a gate of the thirteenth P-type thin film transistor; the thirteenth P-type thin film transistor, and a gate of the thirteenth P-type thin film transistor is electrically coupled to the drain of the fourteenth P-type thin film transistor and the source of the tenth P-type thin film transistor, and a source is electrically coupled to a second backward high frequency clock signal, and a drain is electrically coupled to a source of a twelfth P-type thin film transistor; the twelfth P-type thin film transistor, and a gate of the twelfth P-type thin film transistor is electrically coupled to the second backward high frequency clock signal, and a source is electrically coupled to the drain of the thirteenth P-type thin film transistor, and a drain is electrically coupled to the fourth node; the second capacitor, and the one end of the second capacitor is electrically coupled to the drain of the fourteenth P-type thin film transistor, and the other end is electrically coupled to a constant high voltage level;

in the GOA unit circuit of the n+1th stage, the gate of the first P-type thin film transistor is electrically coupled to the first backward high frequency clock signal, and the gate of the second P-type thin film transistor is electrically coupled to the first high frequency clock signal, and both the sources of the fifth and fifteenth P-type thin film transistors are electrically coupled to the second backward high frequency clock signal, and both the gate and the source of the fourteenth P-type thin film transistor are electrically coupled to the second backward high frequency clock signal, and both the source of the thirteenth P-type thin film transistor and the gate of the twelfth P-type thin film transistor are electrically coupled to the second high frequency clock signal;

the first high frequency clock signal and the first backward high frequency clock signal are inverse in phase, and the second high frequency clock signal and the second backward high frequency clock signal are inverse in phase;

as the GOA circuit based on P-type thin film transistor performs forward scan, time sequences of the first high frequency clock signal and the second backward high frequency clock signal are consistent, and time sequences of the first backward high frequency clock signal and the second high frequency clock signal are consistent;

as the GOA circuit based on P-type thin film transistor performs backward scan, time sequences of the first high frequency clock signal and the second high frequency clock signal are consistent, and time sequences of the first backward high frequency clock signal and the second backward high frequency clock signal are consistent.

In the first stage connection of the GOA circuit based on P-type thin film transistor, the source of the first P-type thin film transistor is electrically coupled to a start signal.

In the last stage connection of the GOA circuit based on P-type thin film transistor, the source of the second P-type thin film transistor is electrically coupled to a start signal.

As the GOA circuit based on P-type thin film transistor performs forward scan, the second backward high frequency clock signal can be replaced by the first high frequency clock signal, and the second high frequency clock signal can be replaced by the first backward high frequency clock signal;

as the GOA circuit based on P-type thin film transistor performs backward scan, the second high frequency clock signal can be replaced by the first high frequency clock signal, and the second backward high frequency clock signal can be replaced by the first backward high frequency clock signal.

The GOA circuit based on P-type thin film transistor comprises four high frequency clock signal lines or two high frequency clock signal lines.

The GOA unit circuit of every stage further comprises a sixteenth P-type thin film transistor, and a gate of the sixteenth P-type thin film transistor is electrically coupled to a stage transfer signal, and a source is electrically coupled to the fourth node, and a drain is electrically coupled to the constant high voltage level.

The GOA unit circuit of every stage further comprises a sixteenth P-type thin film transistor, and a gate of the sixteenth P-type thin film transistor is electrically coupled to the fourth node, and a source is electrically coupled to the first node, and a drain is electrically coupled to the constant high voltage level.

The GOA unit circuit of every stage further comprises a sixteenth P-type thin film transistor, and a gate of the sixteenth P-type thin film transistor is electrically coupled to the fourth node, and a source is electrically coupled to the first node, and a drain is electrically coupled to the constant high voltage level; a seventeenth P-type thin film transistor, and a source of the seventeenth P-type thin film transistor is electrically coupled to the drain of the fourth P-type thin film transistor, and a drain is electrically coupled to the third node, and in the GOA unit circuit of the nth stage, the gate of the seventeenth P-type thin film transistor is electrically coupled to the second backward high frequency clock signal, and in the GOA unit circuit of the n+1th stage, the gate of the seventeenth P-type thin film transistor is electrically coupled to the second high frequency clock signal; a third capacitor, and one end of the third capacitor is electrically coupled to the third node, and the other end is electrically coupled to the stage transfer signal.

In an output period of the GOA circuit based on P-type thin film transistor, the third node is low voltage level, and the fourth node is high voltage level; after the output is finished, the third node is high voltage level, and the fourth node is low voltage level.

All material of respective thin film transistors is Low Temperature Poly-silicon.

The present invention further provides a GOA circuit based on P-type thin film transistor, comprising a plurality of GOA unit circuits which are cascade connected, and the GOA unit circuit of every stage comprises a forward-backward scan module, an output module, a pull-down holding module and a pull-down module; n is set to be a positive integer, and the GOA unit circuit of the nth stage and the GOA unit circuit of the n+1th stage adjacent thereto are one cycle;

except the GOA unit circuit of the first and last stages, in the GOA unit circuit of the nth stage:

the forward-backward scan module comprises: a first P-type thin film transistor, and a gate of the first P-type thin film transistor is electrically coupled to a first high frequency clock signal, and a source is electrically coupled to a stage transfer signal of the GOA unit circuit of the former n−1th stage, and a drain is electrically coupled to a first node; a second P-type thin film transistor, and a gate of the second P-type thin film transistor is electrically coupled to a first backward high frequency clock signal, and a source is electrically coupled to a stage transfer signal of the GOA unit circuit of the latter n+1th stage, and a drain is electrically coupled to the first node;

the output module comprises: a third P-type thin film transistor, and a gate of the third P-type thin film transistor is electrically coupled to the first node, and a source is electrically coupled to a second node, and a drain is electrically coupled to a constant low voltage level and a gate of a fourth P-type thin film transistor; the fourth P-type thin film transistor, and a gate of the fourth P-type thin film transistor is electrically coupled to the constant low voltage level and the drain of the third P-type thin film transistor, and a source is electrically coupled to the second node, and a drain is electrically coupled to a third node; a fifth P-type thin film transistor, and a gate of the fifth P-type thin film transistor is electrically coupled to a third node, and a source is electrically coupled to a second high frequency clock signal, and a drain is electrically coupled to the stage transfer signal; a fifteenth P-type thin film transistor, and a gate of the fifteenth P-type thin film transistor is electrically coupled to the third node, and a source is electrically coupled to the second high frequency clock signal, and a drain is electrically coupled to a scan signal; a first capacitor, and one end of the first capacitor is electrically coupled to the second node, and the other end is electrically coupled to a constant high voltage level;

the pull-down holding module comprises: an eleventh P-type thin film transistor, and a gate of the eleventh P-type thin film transistor is electrically coupled to a fourth node, and a source is electrically coupled to the second node, and a drain is electrically coupled to the constant high voltage level; a seventh P-type thin film transistor, and a gate of the seventh P-type thin film transistor is electrically coupled to the fourth node, and a source is electrically coupled to the stage transfer signal, and a drain is electrically coupled to the constant high voltage level; an eighth P-type thin film transistor, and a gate of the eighth P-type thin film transistor is electrically coupled to the fourth node, and a source is electrically coupled to the scan signal, and a drain is electrically coupled to the constant high voltage level;

the pull-down module comprises: a tenth P-type thin film transistor, and a gate of the tenth P-type thin film transistor is electrically coupled to the first node, and a source is electrically coupled to a gate of a thirteenth P-type thin film transistor, and a drain is electrically coupled to the constant high voltage level; a ninth P-type thin film transistor, and a gate of the ninth P-type thin film transistor is electrically coupled to the first node, and a source is electrically coupled to the fourth node, and a drain is electrically coupled to the constant high voltage level;

the GOA unit circuit of the nth stage further comprises: a fourteenth P-type thin film transistor, and both a gate and a source of the fourteenth P-type thin film transistor are electrically coupled to the second high frequency clock signal, and a drain is electrically coupled to one end of a second capacitor and a gate of the thirteenth P-type thin film transistor; the thirteenth P-type thin film transistor, and a gate of the thirteenth P-type thin film transistor is electrically coupled to the drain of the fourteenth P-type thin film transistor and the source of the tenth P-type thin film transistor, and a source is electrically coupled to a second backward high frequency clock signal, and a drain is electrically coupled to a source of a twelfth P-type thin film transistor; the twelfth P-type thin film transistor, and a gate of the twelfth P-type thin film transistor is electrically coupled to the second backward high frequency clock signal, and a source is electrically coupled to the drain of the thirteenth P-type thin film transistor, and a drain is electrically coupled to the fourth node; the second capacitor, and the one end of the second capacitor is electrically coupled to the drain of the fourteenth P-type thin film transistor, and the other end is electrically coupled to a constant high voltage level;

in the GOA unit circuit of the n+1th stage, the gate of the first P-type thin film transistor is electrically coupled to the first backward high frequency clock signal, and the gate of the second P-type thin film transistor is electrically coupled to the first high frequency clock signal, and both the sources of the fifth and fifteenth P-type thin film transistors are electrically coupled to the second backward high frequency clock signal, and both the gate and the source of the fourteenth P-type thin film transistor are electrically coupled to the second backward high frequency clock signal, and both the source of the thirteenth P-type thin film transistor and the gate of the twelfth P-type thin film transistor are electrically coupled to the second high frequency clock signal;

the first high frequency clock signal and the first backward high frequency clock signal are inverse in phase, and the second high frequency clock signal and the second backward high frequency clock signal are inverse in phase;

as the GOA circuit based on P-type thin film transistor performs forward scan, time sequences of the first high frequency clock signal and the second backward high frequency clock signal are consistent, and time sequences of the first backward high frequency clock signal and the second high frequency clock signal are consistent;

as the GOA circuit based on P-type thin film transistor performs backward scan, time sequences of the first high frequency clock signal and the second high frequency clock signal are consistent, and time sequences of the first backward high frequency clock signal and the second backward high frequency clock signal are consistent;

wherein in the first stage connection of the GOA circuit based on P-type thin film transistor, the source of the first P-type thin film transistor is electrically coupled to a start signal;

wherein in the last stage connection of the GOA circuit based on P-type thin film transistor, the source of the second P-type thin film transistor is electrically coupled to a start signal.

The benefits of the present invention are: the GOA circuit based on P-type thin film transistor provided by the present invention employs the first high frequency clock signal and the first backward high frequency clock signal to control the forward-backward scan of the P-type thin film transistor and can ease the deterioration of the related thin film transistors in the forward-backward scan module in comparison with the direct current signal control; the first high frequency clock signal and the first backward high frequency clock signal cannot only be the control signals of controlling the forward-backward scan but also can be the signal sources outputted by the scan signal to reduce the loading of the second high frequency clock signal and the second backward high frequency clock signal for reducing the delay of the scan signal. It ensures the smooth output of the scan signal to promote the stability of the GOA circuit and decrease the number of the signal lines and realize the narrow frame design; the pull-down module utilizes the two switch design which can reduce the power consumption of the circuit.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
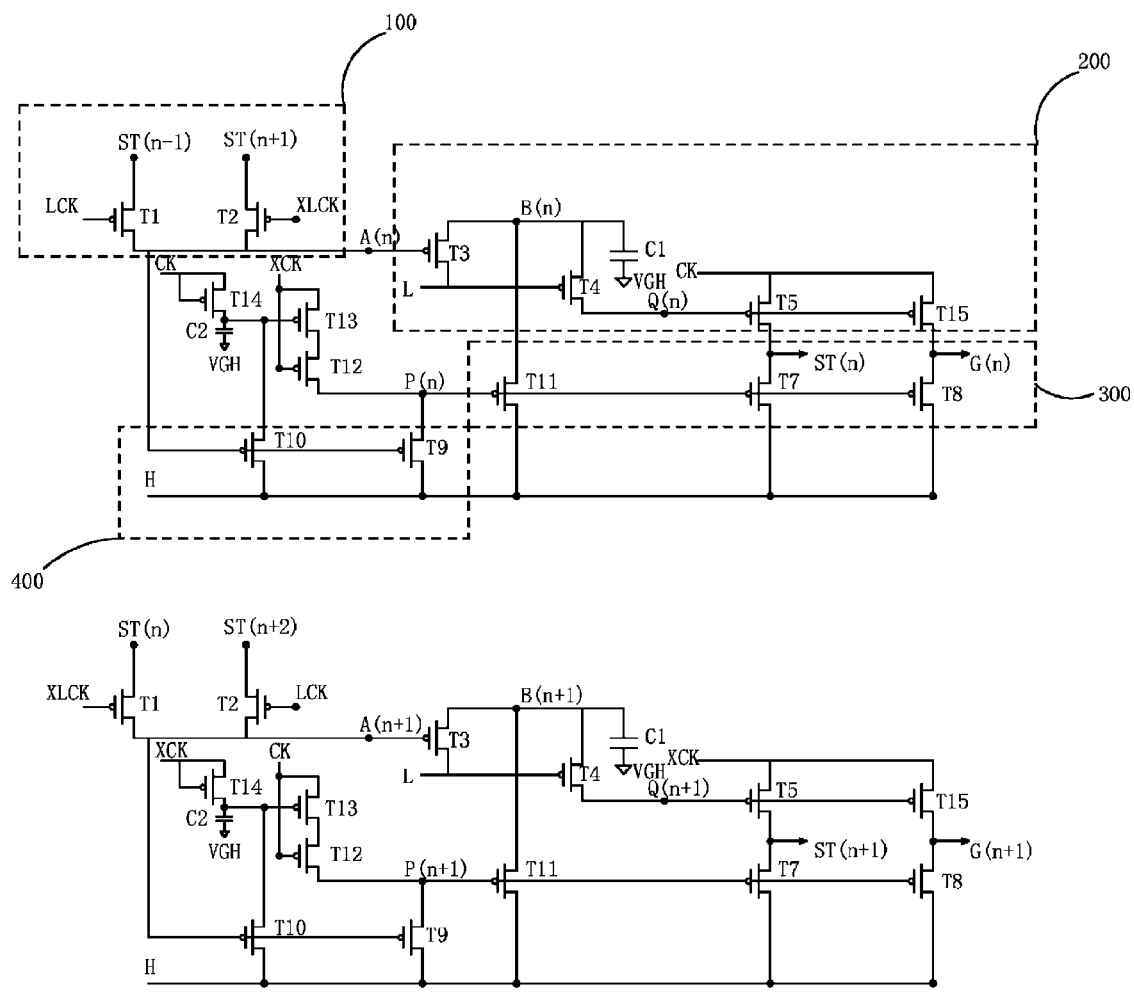
FIG. 1 is a circuit diagram of the first embodiment according to a GOA circuit based on P-type thin film transistor of the present invention.

Please refer to FIG. 1. FIG. 1 is a circuit diagram of the first embodiment of a GOA circuit based on P-type thin film transistor according to the present invention. As shown in FIG. 1, the GOA circuit based on P-type thin film transistor according to the present invention comprises a plurality of GOA unit circuits which are cascade connected, and the GOA unit circuit of every stage comprises a forward-backward scan module 100, an output module 200, a pull-down holding module 300 and a pull-down module 400. n is set to be a positive integer, and the GOA unit circuit of the nth stage and the GOA unit circuit of the n+1th stage adjacent thereto are one cycle.

Except the GOA unit circuit of the first and last stages, in the GOA unit circuit of the nth stage:

the forward-backward scan module 100 comprises: a first P-type thin film transistor T1, and a gate of the first P-type thin film transistor T1 is electrically coupled to a first high frequency clock signal LCK, and a source is electrically coupled to a stage transfer signal ST(n−1) of the GOA unit circuit of the former n−1th stage, and a drain is electrically coupled to a first node A(n); a second P-type thin film transistor T2, and a gate of the second P-type thin film transistor T2 is electrically coupled to a first backward high frequency clock signal XLCK, and a source is electrically coupled to a stage transfer signal ST(n+1) of the GOA unit circuit of the latter n+1th stage, and a drain is electrically coupled to the first node A(n).

The output module 200 comprises: a third P-type thin film transistor T3, and a gate of the third P-type thin film transistor T3 is electrically coupled to the first node A(n), and a source is electrically coupled to a second node B(n), and a drain is electrically coupled to a constant low voltage level L and a gate of a fourth P-type thin film transistor T4; the fourth P-type thin film transistor T4, and a gate of the fourth P-type thin film transistor T4 is electrically coupled to the constant low voltage level L and the drain of the third P-type thin film transistor T3, and a source is electrically coupled to the second node B(n), and a drain is electrically coupled to a third node Q(n); a fifth P-type thin film transistor T5, and a gate of the fifth P-type thin film transistor T5 is electrically coupled to a third node Q(n), and a source is electrically coupled to a second high frequency clock signal CK, and a drain is electrically coupled to the stage transfer signal ST(n); a fifteenth P-type thin film transistor T15, and a gate of the fifteenth P-type thin film transistor T15 is electrically coupled to the third node Q(n), and a source is electrically coupled to the second high frequency clock signal CK, and a drain is electrically coupled to a scan signal G(n); a first capacitor C1, and one end of the first capacitor C1 is electrically coupled to the second node B(n), and the other end is electrically coupled to a constant high voltage level VGH.

The pull-down holding module 300 comprises: an eleventh P-type thin film transistor T11, and a gate of the eleventh P-type thin film transistor T11 is electrically coupled to a fourth node P(n), and a source is electrically coupled to the second node B(n), and a drain is electrically coupled to the constant high voltage level H; a seventh P-type thin film transistor T7, and a gate of the seventh P-type thin film transistor T7 is electrically coupled to the fourth node P(n), and a source is electrically coupled to the stage transfer signal ST(n), and a drain is electrically coupled to the constant high voltage level H; an eighth P-type thin film transistor T8, and a gate of the eighth P-type thin film transistor T8 is electrically coupled to the fourth node P(n), and a source is electrically coupled to the scan signal G(n), and a drain is electrically coupled to the constant high voltage level H.

The pull-down module 400 comprises: a tenth P-type thin film transistor T10, and a gate of the tenth P-type thin film transistor T10 is electrically coupled to the first node A(n), and a source is electrically coupled to a gate of a thirteenth P-type thin film transistor T13, and a drain is electrically coupled to the constant high voltage level H; a ninth P-type thin film transistor T9, and a gate of the ninth P-type thin film transistor T9 is electrically coupled to the first node A(n), and a source is electrically coupled to the fourth node P(n), and a drain is electrically coupled to the constant high voltage level H.

The GOA unit circuit of the nth stage further comprises: a fourteenth P-type thin film transistor T14, and both a gate and a source of the fourteenth P-type thin film transistor T14 are electrically coupled to the second high frequency clock signal CK, and a drain is electrically coupled to one end of a second capacitor C2 and a gate of the thirteenth P-type thin film transistor T13; the thirteenth P-type thin film transistor T13, and a gate of the thirteenth P-type thin film transistor T13 is electrically coupled to the drain of the fourteenth P-type thin film transistor T14 and the source of the tenth P-type thin film transistor T10, and a source is electrically coupled to a second backward high frequency clock signal XCK, and a drain is electrically coupled to a source of a twelfth P-type thin film transistor T12; the twelfth P-type thin film transistor T12, and a gate of the twelfth P-type thin film transistor T12 is electrically coupled to the second backward high frequency clock signal XCK, and a source is electrically coupled to the drain of the thirteenth P-type thin film transistor T13, and a drain is electrically coupled to the fourth node P(n); the second capacitor C2, and the one end of the second capacitor C2 is electrically coupled to the drain of the fourteenth P-type thin film transistor T14, and the other end is electrically coupled to a constant high voltage level VGH.

In the GOA unit circuit of the n+1th stage, except the gate of the first P-type thin film transistor T1 is electrically coupled to the first backward high frequency clock signal XLCK, and the gate of the second P-type thin film transistor T2 is electrically coupled to the first high frequency clock signal LCK, and both the sources of the fifth and fifteenth P-type thin film transistors T5, T15 are electrically coupled to the second backward high frequency clock signal XCK, and both the gate and the source of the fourteenth P-type thin film transistor T14 are electrically coupled to the second backward high frequency clock signal XCK, and both the source of the thirteenth P-type thin film transistor T13 and the gate of the twelfth P-type thin film transistor T12 are electrically coupled to the second high frequency clock signal CK, all the other circuit structures and coupling relationships are the same as the GOA unit circuit of the nth stage. The description is not repeated here.

Particularly, all material of respective thin film transistors in the GOA circuit based on P-type thin film transistor is Low Temperature Poly-silicon. The GOA circuit based on P-type thin film transistor has properties of simple art, low electrical leakage capable of promoting the stability of the GOA circuit.

Figure 2:
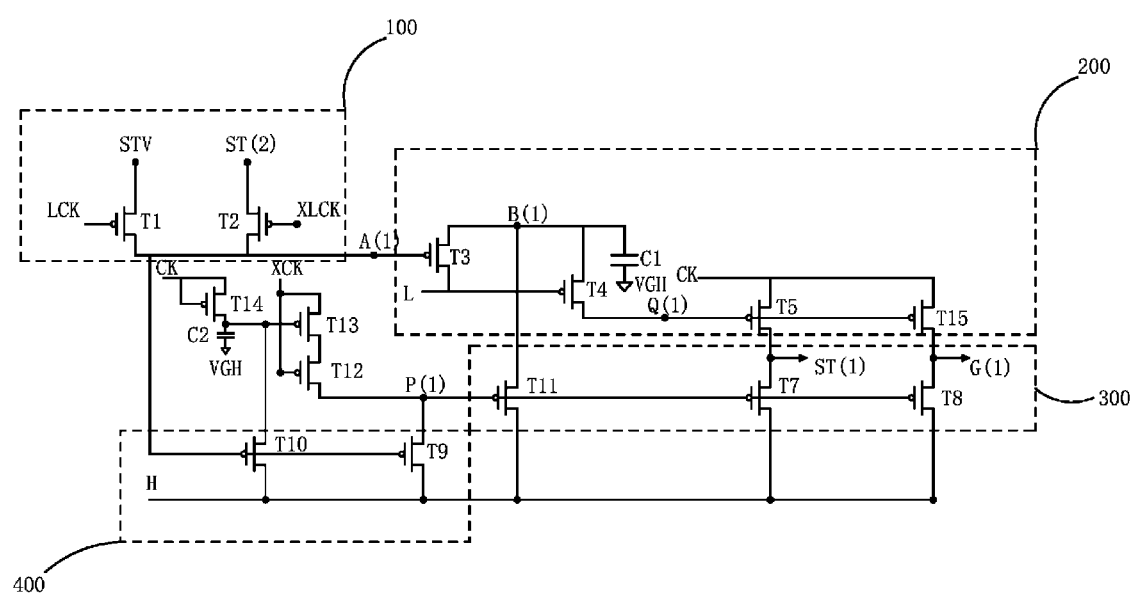
FIG. 2 is a circuit diagram of a GOA unit circuit of the first stage of the first embodiment according to the GOA circuit based on P-type thin film transistor of the present invention.
Figure 3:
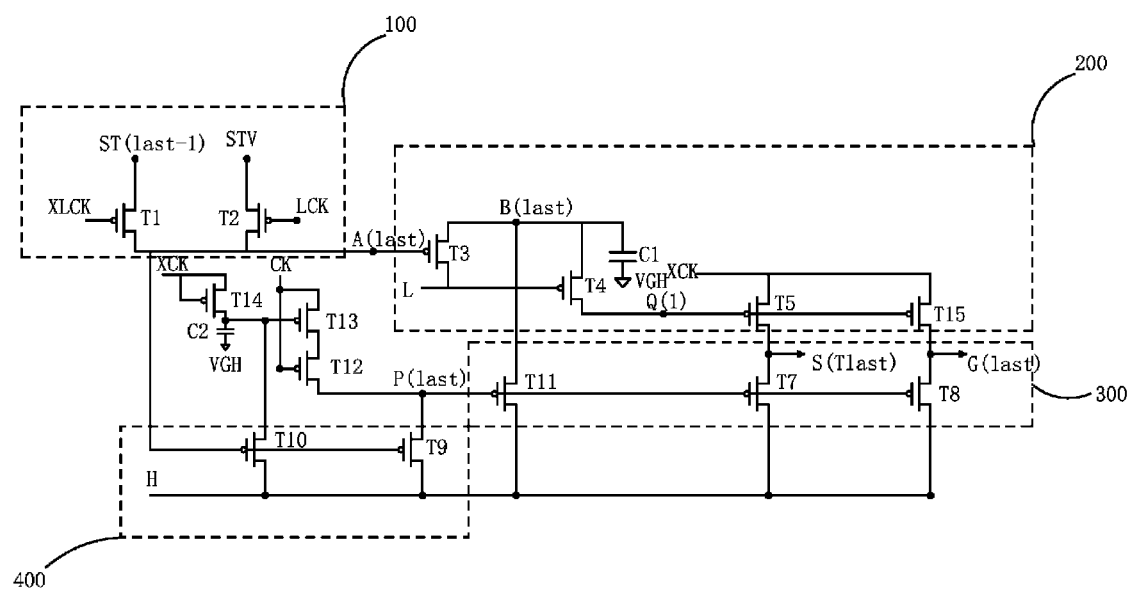
FIG. 3 is a circuit diagram of a GOA unit circuit of the last stage of the first embodiment according to the GOA circuit based on P-type thin film transistor of the present invention.

Please refer to FIG. 2, FIG. 3, in the first stage connection of the GOA circuit based on P-type thin film transistor, the source of the first P-type thin film transistor T1 is electrically coupled to a start signal STV; in the last stage connection of the GOA circuit based on P-type thin film transistor, the source of the second P-type thin film transistor T2 is electrically coupled to a start signal STV.

Figure 8:
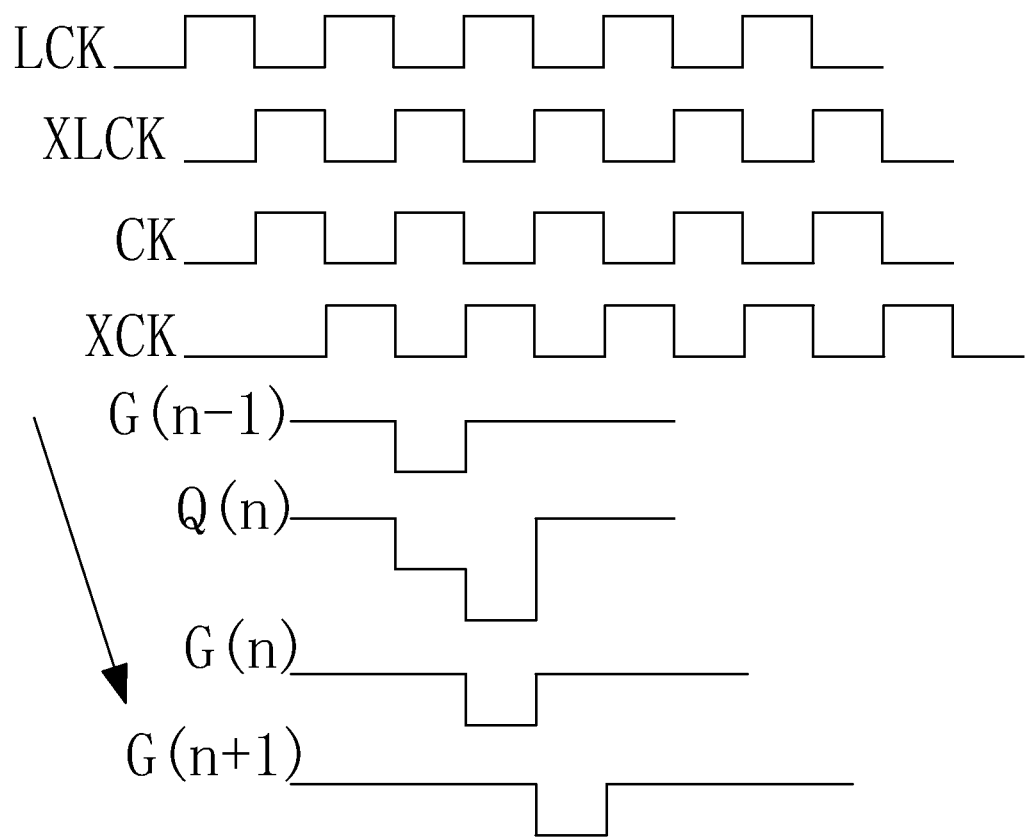
FIG. 8 is a sequence diagram as the GOA circuit based on P-type thin film transistor of the present invention performs forward scan.
Figure 9:
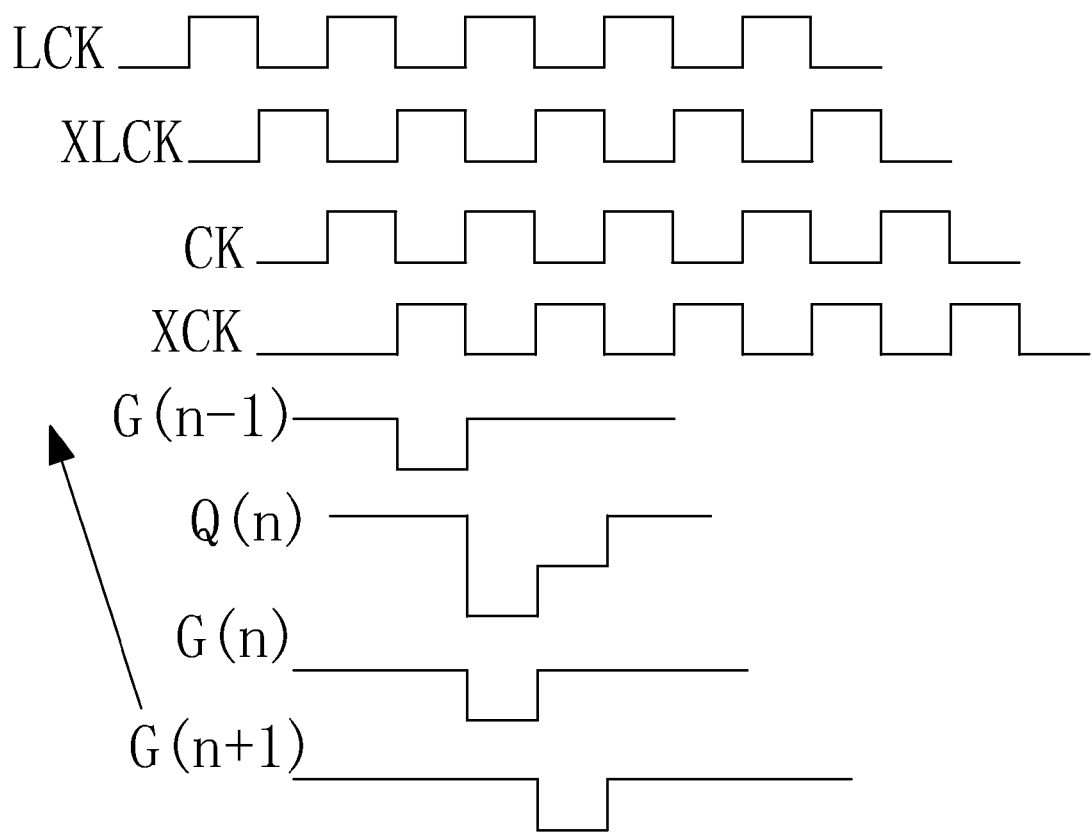
FIG. 9 is a sequence diagram as the GOA circuit based on P-type thin film transistor of the present invention performs backward scan.

Please refer to FIG. 8, FIG. 9. The first high frequency clock signal LCK and the first backward high frequency clock signal XLCK are inverse in phase, and the second high frequency clock signal CK and the second backward high frequency clock signal XCK are inverse in phase.

With FIG. 8 and FIG. 1, as the GOA circuit based on P-type thin film transistor performs forward scan, time sequences of the first high frequency clock signal LCK and the second backward high frequency clock signal XCK are consistent, and time sequences of the first backward high frequency clock signal XLCK and the second high frequency clock signal CK are consistent, and both the sequences and the output sequences of the stage transfer signal ST(n) and the scan signal G(n) are consistent. The specific forward scan procedure can be divided into first, second, third steps;

first step: the first high frequency clock signal LCK provides low voltage level, and the first backward high frequency clock signal XLCK provides high voltage level, and the first P-type thin film transistor T1 is on, and the second P-type thin film transistor T2 is off; the stage transfer signal ST(n−1) of the GOA unit circuit of the n−1th stage provides low voltage level, and the first node A(n) is low voltage level, and both the third, fourth P-type thin film transistors T3, T4 are on, and the third node Q(n) is charged to be low voltage level, and both the fifth, fifteenth P-type thin film transistors T5, T15 are on, and the second high frequency clock signal CK provides high voltage level, and the stage transfer signal ST(n) and the scan signal G(n) output high voltage levels; meanwhile, the ninth, tenth P-type thin film transistors T9, T10 are controlled by the low voltage level of the first node A(n) to be on, and the fourth node P(n) is raised to be high voltage level, and the seventh, eighth P-type thin film transistors T7, T8 are off, and the thirteenth, fourteenth P-type thin film transistors are off to be beneficial for reducing the current and the circuit power consumption.

second step: the stage transfer signal ST(n+1) of the GOA unit circuit of the n+1th stage provides high voltage level, and the first high frequency clock signal LCK provides high voltage level, and the first backward high frequency clock signal XLCK provides low voltage level, and the first P-type thin film transistor T1 is off, and the second P-type thin film transistor T2 is on, and the first node A(n) changes to be high voltage level, and the third P-type thin film transistor T3 is off, and the fourth P-type thin film transistor T4 is on, and the third node Q(n) is influenced by the capacitor C1 and maintains to be low voltage level, and both the fifth, fifteenth P-type thin film transistors T5, T15 are on, and the second high frequency clock signal CK provides low voltage level, and the stage transfer signal ST(n) and the scan signal G(n) smoothly output low voltage levels to achieve the scan row by row, and the fourth node P(n) maintains to be high voltage level, and the seventh, eighth P-type thin film transistors are off; meanwhile, the fourteenth P-type thin film transistor T14 is on, and the second capacitor C2 is charged to be low voltage level.

third step: the first high frequency clock signal LCK provides low voltage level, and the first backward high frequency clock signal XLCK provides high voltage level, and the first P-type thin film transistor T1 is on, and the second P-type thin film transistor T2 is off, and the stage transfer signal ST(n−1) of the GOA unit circuit of the n−1th stage provides high voltage level, and the first node A(n) maintains to be high voltage level, and both the tenth, ninth P-type thin film transistors T10, T9 are off, and the second high frequency clock signal CK provides high voltage level, and the fourteenth P-type thin film transistor T14 is off, and the thirteenth P-type thin film transistor T13 is controlled by the low voltage level of the second capacitor C2 to be on, and the second backward high frequency clock signal XCK provides low voltage level, and the twelfth P-type thin film transistor T12 is on, and the fourth node P(n) changes to be low voltage level, and constantly remains low voltage level in the rest period in a frame, and the eleventh, seventh, eighth P-type thin film transistors T11, T7, T8 are on, and the third node Q(n) is raised to be high voltage level, and, and the fifth, fifteenth P-type thin film transistors T5, T15 are off, and the stage transfer signal ST(n) and the scan signal G(n)

output high voltage levels and maintains to be in such state in the rest period in the frame.

Particularly, the fourteenth P-type thin film transistor T14 and the tenth P-type thin film transistor T10 are not on at the same time. The fourteenth P-type thin film transistor T14 and the twelfth, thirteenth P-type thin film transistors T12, T13 are alternately on. Such two switch design can reduce the power consumption.

With FIG. 9 and FIG. 1, as the GOA circuit based on P-type thin film transistor performs backward scan, time sequences of the first high frequency clock signal LCK and the second high frequency clock signal CK are consistent, and time sequences of the first backward high frequency clock signal XLCK and the second backward high frequency clock signal XCK are consistent. The specific backward scan procedure is the reverse process of the aforesaid forward scan.

Figure 4:
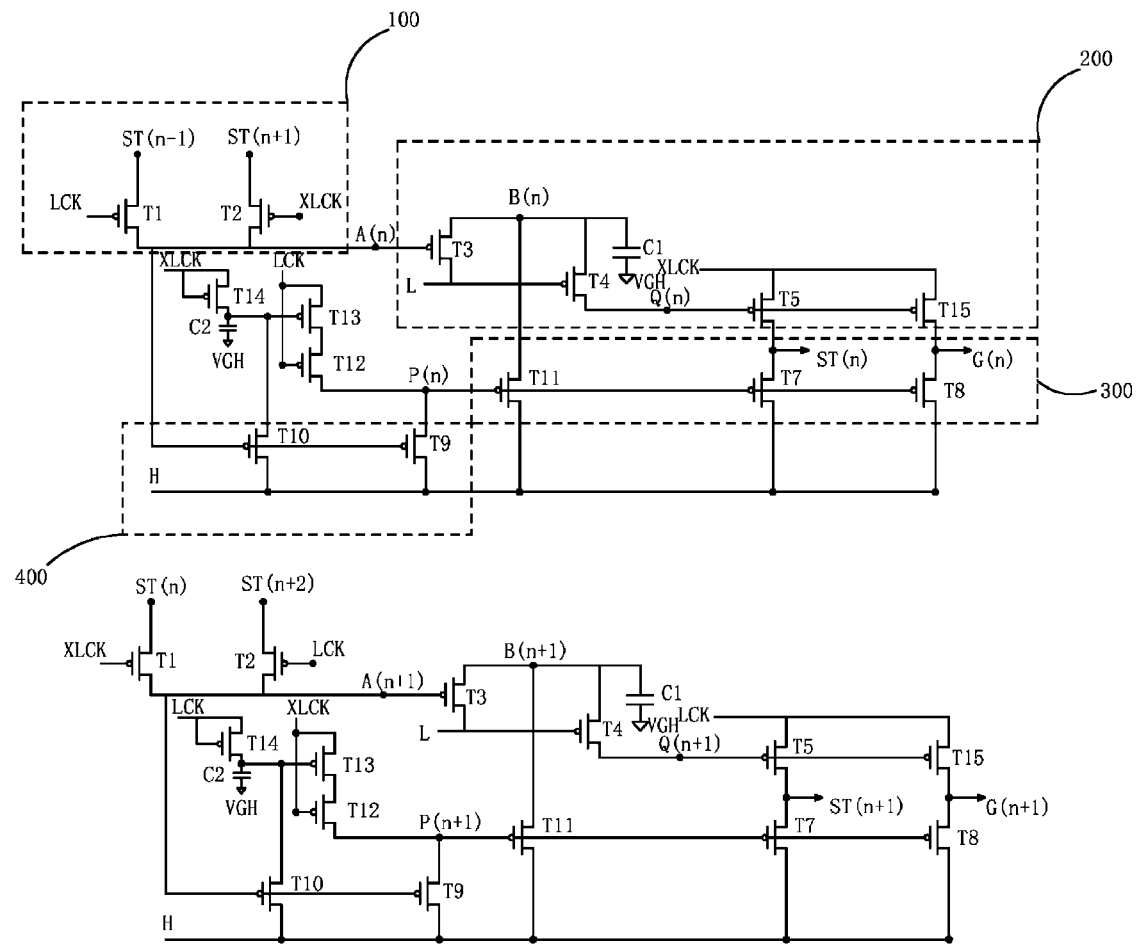
FIG. 4 is a circuit diagram of the second embodiment according to a GOA circuit based on P-type thin film transistor of the present invention.

Please refer to FIG. 4. FIG. 4 is a circuit diagram of the second embodiment according to the present invention. Because the time sequences of the first high frequency clock signal LCK and the second backward high frequency clock signal XCK are consistent, and the time sequences of the first backward high frequency clock signal XLCK and the second high frequency clock signal CK are consistent in forward scan, thus, as performing forward scan, the second backward high frequency clock signal XCK can be replaced by the first high frequency clock signal LCK, and the second high frequency clock signal CK can be replaced by the first backward high frequency clock signal XLCK; but the time sequences of the first high frequency clock signal LCK and the second high frequency clock signal CK are consistent, and the time sequences of the first backward high frequency clock signal XLCK and the second backward high frequency clock signal XCK are consistent in backward scan, thus, as performing backward scan, the second high frequency clock signal CK can be replaced by the first high frequency clock signal LCK, and the second backward high frequency clock signal XCK can be replaced by the first backward high frequency clock signal XLCK. FIG. 4 shows that in forward scan, the first high frequency clock signal LCK and the first backward high frequency clock signal XLCK are employed to replace the second backward high frequency clock signal XCK and the second high frequency clock signal CK. The scan can be achieved with only two high frequency clock signal lines. It is beneficial for narrow frame design. Certainly, it is an option to reserve all four high frequency clock signal lines but the first high frequency clock signal LCK and the first backward high frequency clock signal XLCK can replace part of the second backward high frequency clock signal XCK and the second high frequency clock signal CK to reduce the loading of the second high frequency clock signal CK and the second backward high frequency clock signal XCK for reducing the delay of the scan signal G(n). The reset is the same as FIG. 1. The repeated description is omitted here.

Figure 5:
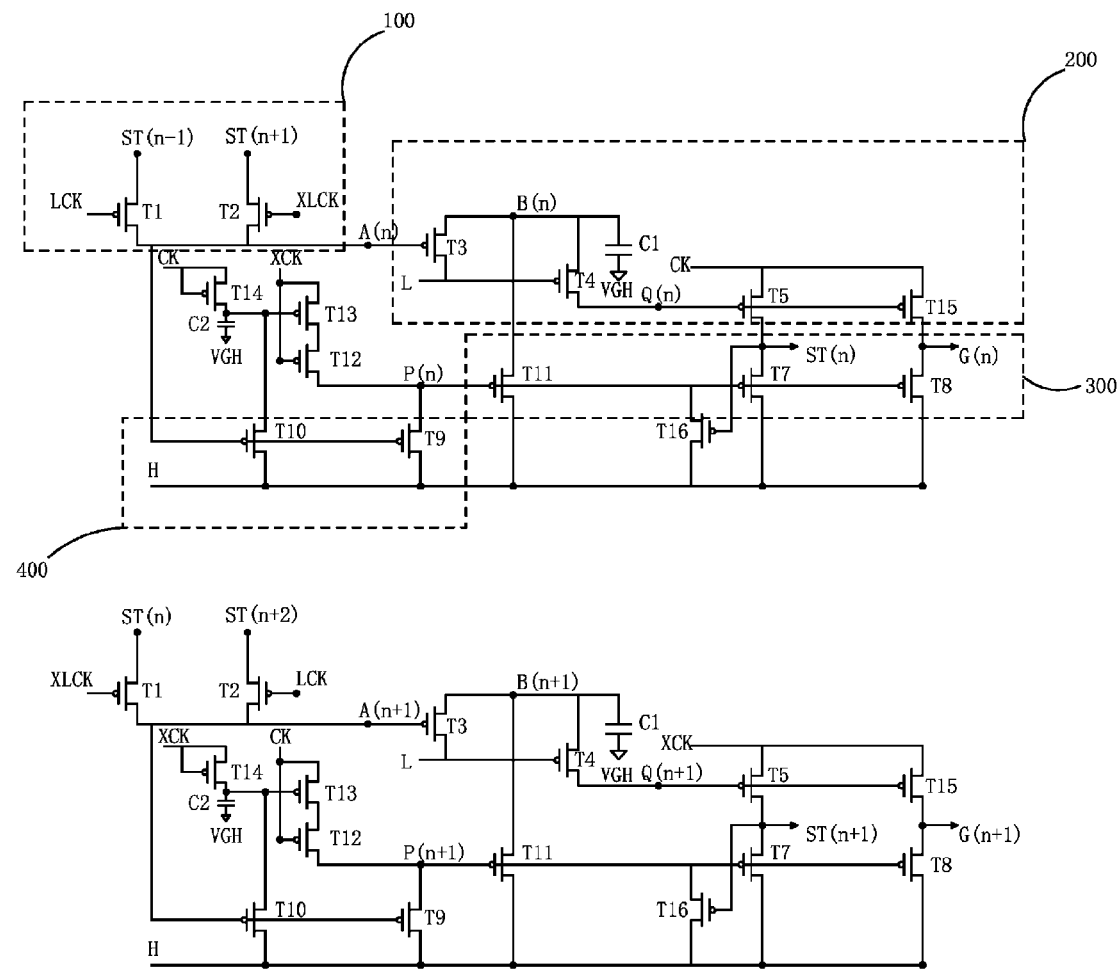
FIG. 5 is a circuit diagram of the third embodiment according to a GOA circuit based on P-type thin film transistor of the present invention.

Please refer to FIG. 5. FIG. 5 is a circuit diagram of the third embodiment according to the present invention. The difference of FIG. 5 and FIG. 1 is that the GOA unit circuit of every stage further comprises a sixteenth P-type thin film transistor T16, and a gate of the sixteenth P-type thin film transistor T16 is electrically coupled to a stage transfer signal ST(n), and a source is electrically coupled to the fourth node P(n), and a drain is electrically coupled to the constant high voltage level H. In the output period, the scan signal G(n) is low voltage level, and the sixteenth P-type thin film transistor T16 is on to raise the voltage level of the fourth node P(n) to ensure that P point is stably at high voltage level to promote the output quality of the scan signal G(n). After the output is finished, the sixteenth P-type thin film transistor T16 is off. The reset is the same as FIG. 1. The repeated description is omitted here.

Figure 6:
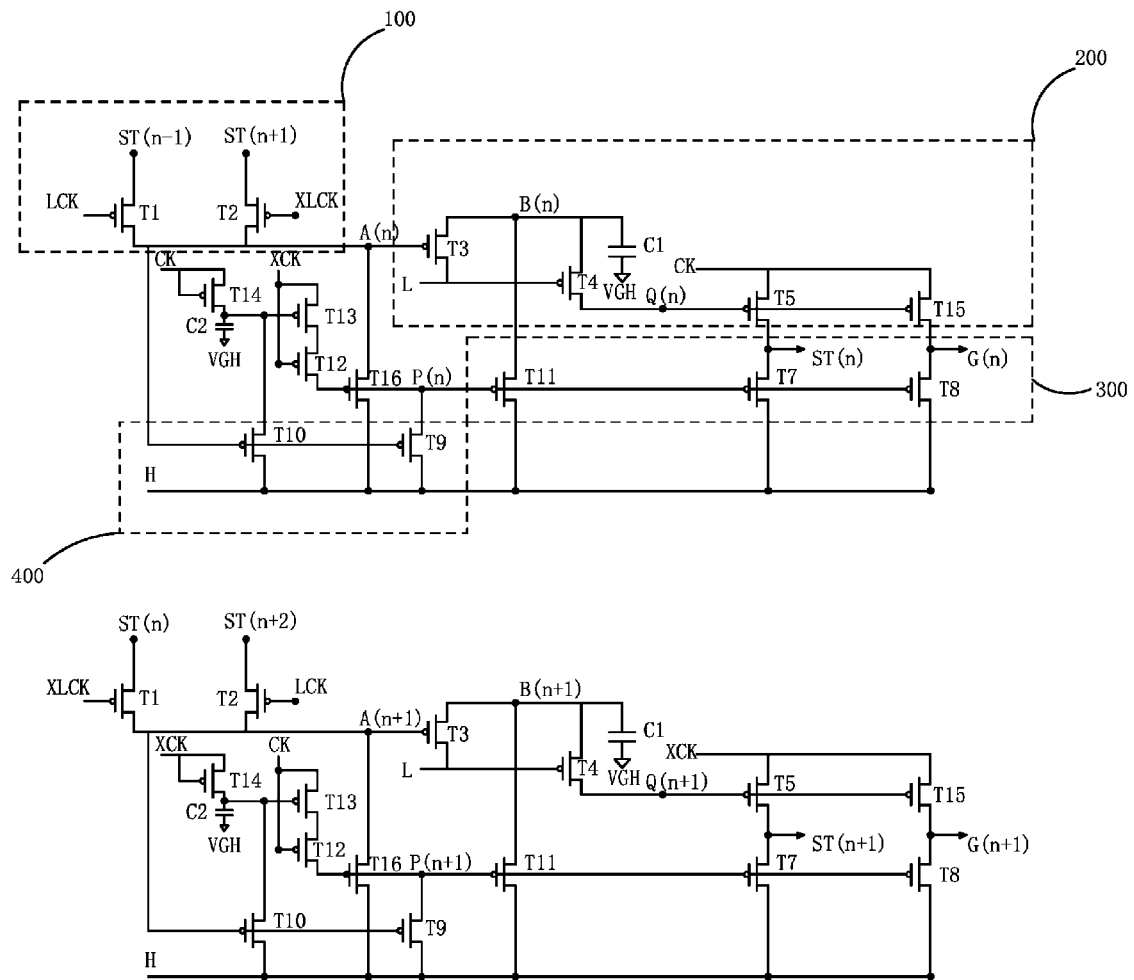
FIG. 6 is a circuit diagram of the fourth embodiment according to a GOA circuit based on P-type thin film transistor of the present invention.

Please refer to FIG. 6. FIG. 6 is a circuit diagram of the fourth embodiment according to the present invention. The difference of FIG. 6 and FIG. 1 is that the GOA unit circuit of every stage further comprises a sixteenth P-type thin film transistor T16, and a gate of the sixteenth P-type thin film transistor T16 is electrically coupled to the fourth node P(n), and a source is electrically coupled to the first node A(n), and a drain is electrically coupled to the constant high voltage level H. In non functioning period (after the output of the scan signal G(n) is finished), the voltage level of the first node A(n) will be influenced by the coupling capacitance generated by the first high frequency clock signal LCK and the first backward high frequency clock signal XLCK. Although the time sequences of the first high frequency clock signal LCK and the first backward high frequency clock signal XLCK are inverse and the coupling capacitance can cancel each other out in a considerable degree. However, as the element difference is considered, the added sixteenth P-type thin film transistor T16 can stable the voltage level of the first node A(n) in non functioning period. The reset is the same as FIG. 1. The repeated description is omitted here.

Figure 7:
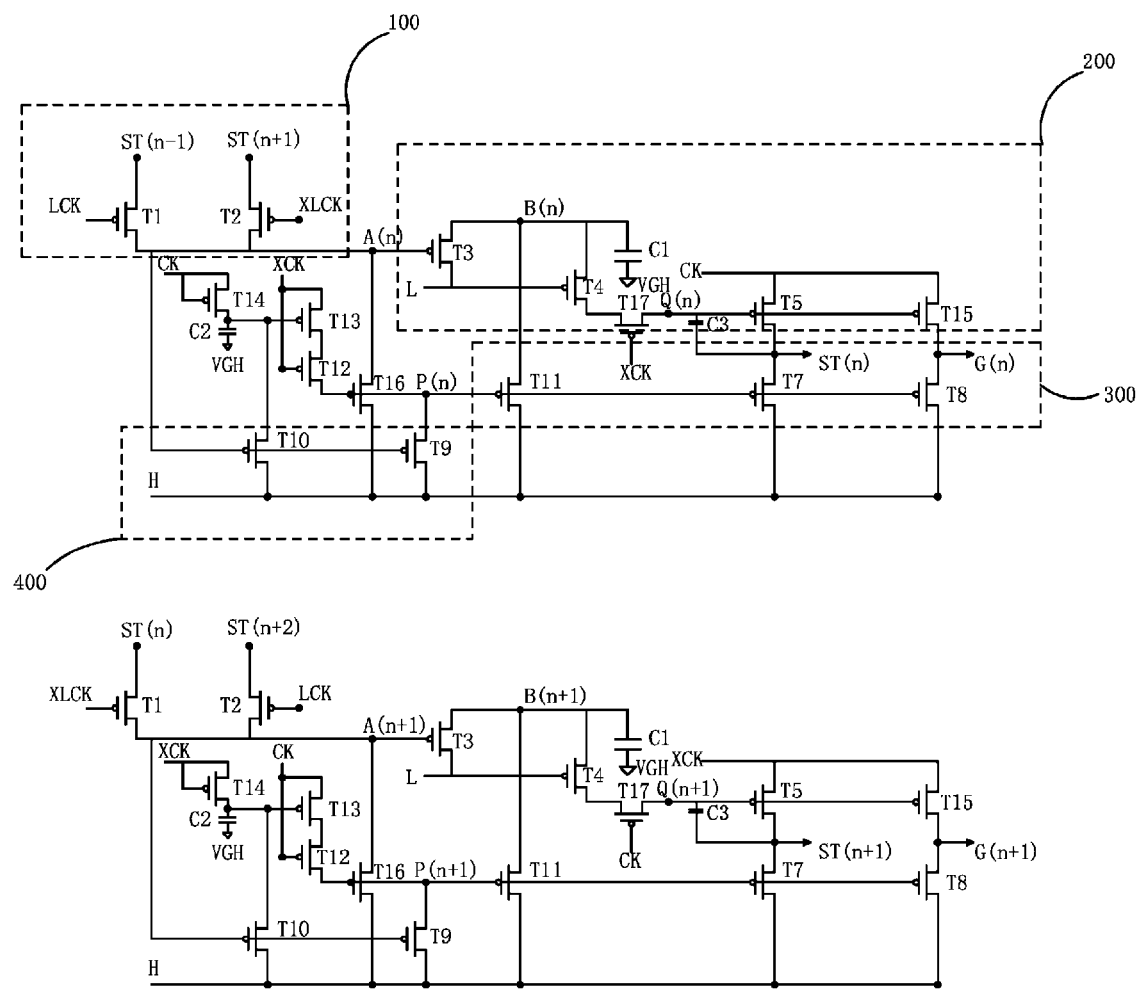
FIG. 7 is a circuit diagram of the fifth embodiment according to a GOA circuit based on P-type thin film transistor of the present invention.

Please refer to FIG. 7. FIG. 7 is a circuit diagram of the fifth embodiment according to the present invention. The difference of FIG. 7 and FIG. 1 is that the GOA unit circuit of every stage further comprises a sixteenth P-type thin film transistor T16, and a gate of the sixteenth P-type thin film transistor T16 is electrically coupled to the fourth node P(n), and a source is electrically coupled to the first node A(n), and a drain is electrically coupled to the constant high voltage level H; a seventeenth P-type thin film transistor T17, and a source of the seventeenth P-type thin film transistor T17 is electrically coupled to the drain of the fourth P-type thin film transistor T4, and a drain is electrically coupled to the third node Q(n), and in the GOA unit circuit of the nth stage, the gate of the seventeenth P-type thin film transistor T17 is electrically coupled to the second backward high frequency clock signal XCK, and in the GOA unit circuit of the n+1th stage, the gate of the seventeenth P-type thin film transistor T17 is electrically coupled to the second high frequency clock signal CK; a third capacitor C3, and one end of the third capacitor C3 is electrically coupled to the third node Q(n), and the other end is electrically coupled to the stage transfer signal ST(n). FIG. 7 further adds the seventeenth P-type thin film transistor T17 and the third capacitor C3 beside the sixteenth P-type thin film transistor T16 is similarly coupled in FIG. 6, which can diminish the coupling capacitance and stable the voltage level of the third node Q(n); in the output step of the scan signal G(n), the seventeenth P-type thin film transistor T17 is off, and the third capacitor C3 can raise the gate voltage level of the fifteenth P-type thin film transistor T15 and reduce the delay of the scan signal G(n). The reset is the same as FIG. 1. The repeated description is omitted here.

In conclusion, the GOA circuit based on P-type thin film transistor according to the present invention employs the first high frequency clock signal and the first backward high frequency clock signal to control the forward-backward scan of the P-type thin film transistor and can ease the deterioration of the related thin film transistors in the forward-backward scan module in comparison with the direct current signal control; the first high frequency clock signal and the first backward high frequency clock signal cannot only be the control signals of controlling the forward-backward scan but also can be the signal sources outputted by the scan signal to reduce the loading of the second high frequency clock signal and the second backward high frequency clock signal for reducing the delay of the scan signal. It ensures the smooth output of the scan signal to promote the stability of the GOA circuit and decrease the number of the signal lines and realize the narrow frame design; the pull-down module utilizes the two switch design which can reduce the power consumption of the circuit.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA circuit based on P-type thin film transistors, comprising a plurality of GOA unit circuits which have n stages and are cascade connected, and the GOA unit circuit of every stage, except for the GOA unit circuit of a first and a last stage, comprises a forward-backward scan module, an output module, a pull-down holding module and a pull-down module; n is set to be a positive integer, in the GOA unit circuit of an nth stage:

the forward-backward scan module comprises: a first P-type thin film transistor, and a gate of the first P-type thin film transistor is electrically coupled to a first high frequency clock signal, and a source is electrically coupled to a stage transfer signal of the GOA unit circuit of an n−1th stage, and a drain is electrically coupled to a first node; a second P-type thin film transistor, and a gate of the second P-type thin film transistor is electrically coupled to a first backward high frequency clock signal, and a source is electrically coupled to a stage transfer signal of the GOA unit circuit of an n+1th stage, and a drain is electrically coupled to the first node;

the output module comprises: a third P-type thin film transistor, and a gate of the third P-type thin film transistor is electrically coupled to the first node, and a source is electrically coupled to a second node, and a drain is electrically coupled to a constant low voltage level and a gate of a fourth P-type thin film transistor; the fourth P-type thin film transistor, and a gate of the fourth P-type thin film transistor is electrically coupled to the constant low voltage level and the drain of the third P-type thin film transistor, and a source is electrically coupled to the second node, and a drain is electrically coupled to a third node; a fifth P-type thin film transistor, and a gate of the fifth P-type thin film transistor is electrically coupled to a third node, and a source is electrically coupled to a second high frequency clock signal, and a drain is electrically coupled to the stage transfer signal; a fifteenth P-type thin film transistor, and a gate of the fifteenth P-type thin film transistor is electrically coupled to the third node, and a source is electrically coupled to the second high frequency clock signal, and a drain is electrically coupled to a scan signal; a first capacitor, and one end of the first capacitor is electrically coupled to the second node, and the other end is electrically coupled to a constant high voltage level;

the pull-down holding module comprises: an eleventh P-type thin film transistor, and a gate of the eleventh P-type thin film transistor is electrically coupled to a fourth node, and a source is electrically coupled to the second node, and a drain is electrically coupled to the constant high voltage level; a seventh P-type thin film transistor, and a gate of the seventh P-type thin film transistor is electrically coupled to the fourth node, and a source is electrically coupled to the stage transfer signal, and a drain is electrically coupled to the constant high voltage level; an eighth P-type thin film transistor, and a gate of the eighth P-type thin film transistor is electrically coupled to the fourth node, and a source is electrically coupled to the scan signal, and a drain is electrically coupled to the constant high voltage level;

the pull-down module comprises: a tenth P-type thin film transistor, and a gate of the tenth P-type thin film transistor is electrically coupled to the first node, and a source is electrically coupled to a gate of a thirteenth P-type thin film transistor, and a drain is electrically coupled to the constant high voltage level; a ninth P-type thin film transistor, and a gate of the ninth P-type thin film transistor is electrically coupled to the first node, and a source is electrically coupled to the fourth node, and a drain is electrically coupled to the constant high voltage level;

the GOA unit circuit of the nth stage further comprises: a fourteenth P-type thin film transistor, and both a gate and a source of the fourteenth P-type thin film transistor are electrically coupled to the second high frequency clock signal, and a drain is electrically coupled to one end of a second capacitor and the gate of the thirteenth P-type thin film transistor; the thirteenth P-type thin film transistor, and a gate of the thirteenth P-type thin film transistor is electrically coupled to the drain of the fourteenth P-type thin film transistor and the source of the tenth P-type thin film transistor, and a source is electrically coupled to a second backward high frequency clock signal, and a drain is electrically coupled to a source of a twelfth P-type thin film transistor; the twelfth P-type thin film transistor, and a gate of the twelfth P-type thin film transistor is electrically coupled to the second backward high frequency clock signal, and a source is electrically coupled to the drain of the thirteenth P-type thin film transistor, and a drain is electrically coupled to the fourth node; the second capacitor, and the one end of the second capacitor is electrically coupled to the drain of the fourteenth P-type thin film transistor, and the other end is electrically coupled to a constant high voltage level;

in the GOA unit circuit of the n+1th stage, the gate of the first P-type thin film transistor is electrically coupled to the first backward high frequency clock signal, and the gate of the second P-type thin film transistor is electrically coupled to the first high frequency clock signal, and both the sources of the fifth and fifteenth P-type thin film transistors are electrically coupled to the second backward high frequency clock signal, and both the gate and the source of the fourteenth P-type thin film transistor are electrically coupled to the second backward high frequency clock signal, and both the source of the thirteenth P-type thin film transistor and the gate of the twelfth P-type thin film transistor are electrically coupled to the second high frequency clock signal;

the first high frequency clock signal and the first backward high frequency clock signal are inverse in phase, and the second high frequency clock signal and the second backward high frequency clock signal are inverse in phase;

as the GOA circuit based on P-type thin film transistors performs forward scan, the first high frequency clock signal and the second backward high frequency clock signal are consistent in pulse period, pulse waveform and phase, and the first backward high frequency clock signal and the second high frequency clock signal are consistent in pulse period, pulse waveform and phase;

as the GOA circuit based on P-type thin film transistors performs backward scan, the first high frequency clock signal and the second high frequency clock signal are consistent in pulse period, pulse waveform and phase, and the first backward high frequency clock signal and the second backward high frequency clock signal are consistent in pulse period, pulse waveform and phase.

2. The GOA circuit based on P-type thin film transistors according to claim 1, wherein in the first stage connection of the GOA circuit based on P-type thin film transistors, the source of the first P-type thin film transistor is electrically coupled to a start signal.

3. The GOA circuit based on P-type thin film transistors according to claim 1, wherein in the last stage connection of the GOA circuit based on P-type thin film transistors, the source of the second P-type thin film transistor is electrically coupled to a start signal.

4. The GOA circuit based on P-type thin film transistors according to claim 1, wherein as the GOA circuit based on P-type thin film transistors performs forward scan, the second backward high frequency clock signal can be replaced by the first high frequency clock signal, and the second high frequency clock signal can be replaced by the first backward high frequency clock signal;

as the GOA circuit based on P-type thin film transistors performs backward scan, the second high frequency clock signal can be replaced by the first high frequency clock signal, and the second backward high frequency clock signal can be replaced by the first backward high frequency clock signal.

5. The GOA circuit based on P-type thin film transistors according to claim 4, wherein the GOA circuit based on P-type thin film transistors comprises four high frequency clock signal lines or two high frequency clock signal lines.

6. The GOA circuit based on P-type thin film transistors according to claim 1, wherein the GOA unit circuit of every stage further comprises a sixteenth P-type thin film transistor, and a gate of the sixteenth P-type thin film transistor is electrically coupled to a stage transfer signal, and a source is electrically coupled to the fourth node, and a drain is electrically coupled to the constant high voltage level.

7. The GOA circuit based on P-type thin film transistors according to claim 1, wherein the GOA unit circuit of every stage further comprises a sixteenth P-type thin film transistor, and a gate of the sixteenth P-type thin film transistor is electrically coupled to the fourth node, and a source is electrically coupled to the first node, and a drain is electrically coupled to the constant high voltage level.

8. The GOA circuit based on P-type thin film transistors according to claim 1, wherein the GOA unit circuit of every stage further comprises a sixteenth P-type thin film transistor, and a gate of the sixteenth P-type thin film transistor is electrically coupled to the fourth node, and a source is electrically coupled to the first node, and a drain is electrically coupled to the constant high voltage level; a seventeenth P-type thin film transistor, and a source of the seventeenth P-type thin film transistor is electrically coupled to the drain of the fourth P-type thin film transistor, and a drain is electrically coupled to the third node, and in the GOA unit circuit of the nth stage, the gate of the seventeenth P-type thin film transistor is electrically coupled to the second backward high frequency clock signal, and in the GOA unit circuit of the n+1th stage, the gate of the seventeenth P-type thin film transistor is electrically coupled to the second high frequency clock signal; a third capacitor, and one end of the third capacitor is electrically coupled to the third node, and the other end is electrically coupled to the stage transfer signal.

9. The GOA circuit based on P-type thin film transistors according to claim 1, wherein in an output period of the GOA circuit based on P-type thin film transistors, the third node is low voltage level, and the fourth node is high voltage level; after the output is finished, the third node is high voltage level, and the fourth node is low voltage level.

10. The GOA circuit based on P-type thin film transistors according to claim 1, wherein all material of respective thin film transistors is Low Temperature Poly-silicon.

11. A GOA circuit based on P-type thin film transistors, comprising a plurality of GOA unit circuits which have n stages and are cascade connected, and the GOA unit circuit of every stage, except for the GOA unit circuit of a first and a last stage, comprises a forward-backward scan module, an output module, a pull-down holding module and a pull-down module; n is set to be a positive integer, in the GOA unit circuit of an nth stage:

the forward-backward scan module comprises: a first P-type thin film transistor, and a gate of the first P-type thin film transistor is electrically coupled to a first high frequency clock signal, and a source is electrically coupled to a stage transfer signal of the GOA unit circuit of an n−1th stage, and a drain is electrically coupled to a first node; a second P-type thin film transistor, and a gate of the second P-type thin film transistor is electrically coupled to a first backward high frequency clock signal, and a source is electrically coupled to a stage transfer signal of the GOA unit circuit of an n+1th stage, and a drain is electrically coupled to the first node;

the output module comprises: a third P-type thin film transistor, and a gate of the third P-type thin film transistor is electrically coupled to the first node, and a source is electrically coupled to a second node, and a drain is electrically coupled to a constant low voltage level and a gate of a fourth P-type thin film transistor; the fourth P-type thin film transistor, and a gate of the fourth P-type thin film transistor is electrically coupled to the constant low voltage level and the drain of the third P-type thin film transistor, and a source is electrically coupled to the second node, and a drain is electrically coupled to a third node; a fifth P-type thin film transistor, and a gate of the fifth P-type thin film transistor is electrically coupled to a third node, and a source is electrically coupled to a second high frequency clock signal, and a drain is electrically coupled to the stage transfer signal; a fifteenth P-type thin film transistor, and a gate of the fifteenth P-type thin film transistor is electrically coupled to the third node, and a source is electrically coupled to the second high frequency clock signal, and a drain is electrically coupled to a scan signal; a first capacitor, and one end of the first capacitor is electrically coupled to the second node, and the other end is electrically coupled to a constant high voltage level;

the pull-down holding module comprises: an eleventh P-type thin film transistor, and a gate of the eleventh P-type thin film transistor is electrically coupled to a fourth node, and a source is electrically coupled to the second node, and a drain is electrically coupled to the constant high voltage level; a seventh P-type thin film transistor, and a gate of the seventh P-type thin film transistor is electrically coupled to the fourth node, and a source is electrically coupled to the stage transfer signal, and a drain is electrically coupled to the constant high voltage level; an eighth P-type thin film transistor, and a gate of the eighth P-type thin film transistor is electrically coupled to the fourth node, and a source is electrically coupled to the scan signal, and a drain is electrically coupled to the constant high voltage level;

the pull-down module comprises: a tenth P-type thin film transistor, and a gate of the tenth P-type thin film transistor is electrically coupled to the first node, and a source is electrically coupled to a gate of a thirteenth P-type thin film transistor, and a drain is electrically coupled to the constant high voltage level; a ninth P-type thin film transistor, and a gate of the ninth P-type thin film transistor is electrically coupled to the first node, and a source is electrically coupled to the fourth node, and a drain is electrically coupled to the constant high voltage level;

the GOA unit circuit of the nth stage further comprises: a fourteenth P-type thin film transistor, and both a gate and a source of the fourteenth P-type thin film transistor are electrically coupled to the second high frequency clock signal, and a drain is electrically coupled to one end of a second capacitor and the gate of the thirteenth P-type thin film transistor; the thirteenth P-type thin film transistor, and a gate of the thirteenth P-type thin film transistor is electrically coupled to the drain of the fourteenth P-type thin film transistor and the source of the tenth P-type thin film transistor, and a source is electrically coupled to a second backward high frequency clock signal, and a drain is electrically coupled to a source of a twelfth P-type thin film transistor; the twelfth P-type thin film transistor, and a gate of the twelfth P-type thin film transistor is electrically coupled to the second backward high frequency clock signal, and a source is electrically coupled to the drain of the thirteenth P-type thin film transistor, and a drain is electrically coupled to the fourth node; the second capacitor, and the one end of the second capacitor is electrically coupled to the drain of the fourteenth P-type thin film transistor, and the other end is electrically coupled to a constant high voltage level;

in the GOA unit circuit of the n+1th stage, the gate of the first P-type thin film transistor is electrically coupled to the first backward high frequency clock signal, and the gate of the second P-type thin film transistor is electrically coupled to the first high frequency clock signal, and both the sources of the fifth and fifteenth P-type thin film transistors are electrically coupled to the second backward high frequency clock signal, and both the gate and the source of the fourteenth P-type thin film transistor are electrically coupled to the second backward high frequency clock signal, and both the source of the thirteenth P-type thin film transistor and the gate of the twelfth P-type thin film transistor are electrically coupled to the second high frequency clock signal;

the first high frequency clock signal and the first backward high frequency clock signal are inverse in phase, and the second high frequency clock signal and the second backward high frequency clock signal are inverse in phase;

as the GOA circuit based on P-type thin film transistors performs forward scan, the first high frequency clock signal and the second backward high frequency clock signal are consistent in pulse period, pulse waveform and phase, and the first backward high frequency clock signal and the second high frequency clock signal are consistent in pulse period, pulse waveform and phase;

as the GOA circuit based on P-type thin film transistors performs backward scan, the first high frequency clock signal and the second high frequency clock signal are consistent in pulse period, pulse waveform and phase, and the first backward high frequency clock signal and the second backward high frequency clock signal are consistent in pulse period, pulse waveform and phase;

wherein in the first stage connection of the GOA circuit based on P-type thin film transistors, the source of the first P-type thin film transistor is electrically coupled to a start signal;

wherein in the last stage connection of the GOA circuit based on P-type thin film transistors, the source of the second P-type thin film transistor is electrically coupled to a start signal.

12. The GOA circuit based on P-type thin film transistors according to claim 11, wherein as the GOA circuit based on P-type thin film transistors performs forward scan, the second backward high frequency clock signal can be replaced by the first high frequency clock signal, and the second high frequency clock signal can be replaced by the first backward high frequency clock signal;

as the GOA circuit based on P-type thin film transistors performs backward scan, the second high frequency clock signal can be replaced by the first high frequency clock signal, and the second backward high frequency clock signal can be replaced by the first backward high frequency clock signal.

13. The GOA circuit based on P-type thin film transistors according to claim 12, wherein the GOA circuit based on P-type thin film transistors comprises four high frequency clock signal lines or two high frequency clock signal lines.

14. The GOA circuit based on P-type thin film transistors according to claim 11, wherein the GOA unit circuit of every stage further comprises a sixteenth P-type thin film transistor, and a gate of the sixteenth P-type thin film transistor is electrically coupled to a stage transfer signal, and a source is electrically coupled to the fourth node, and a drain is electrically coupled to the constant high voltage level.

15. The GOA circuit based on P-type thin film transistors according to claim 11, wherein the GOA unit circuit of every stage further comprises a sixteenth P-type thin film transistor, and a gate of the sixteenth P-type thin film transistor is electrically coupled to the fourth node, and a source is electrically coupled to the first node, and a drain is electrically coupled to the constant high voltage level.

16. The GOA circuit based on P-type thin film transistors according to claim 11, wherein the GOA unit circuit of every stage further comprises a sixteenth P-type thin film transistor, and a gate of the sixteenth P-type thin film transistor is electrically coupled to the fourth node, and a source is electrically coupled to the first node, and a drain is electrically coupled to the constant high voltage level; a seventeenth P-type thin film transistor, and a source of the seventeenth P-type thin film transistor is electrically coupled to the drain of the fourth P-type thin film transistor, and a drain is electrically coupled to the third node, and in the GOA unit circuit of the nth stage, the gate of the seventeenth P-type thin film transistor is electrically coupled to the second backward high frequency clock signal, and in the GOA unit circuit of the n+1th stage, the gate of the seventeenth P-type thin film transistor is electrically coupled to the second high frequency clock signal; a third capacitor, and one end of the third capacitor is electrically coupled to the third node, and the other end is electrically coupled to the stage transfer signal.

17. The GOA circuit based on P-type thin film transistors according to claim 11, wherein in an output period of the GOA circuit based on P-type thin film transistors, the third node is low voltage level, and the fourth node is high voltage level; after the output is finished, the third node is high voltage level, and the fourth node is low voltage level.

18. The GOA circuit based on P-type thin film transistors according to claim 11, wherein all material of respective thin film transistors is Low Temperature Poly-silicon.

\* \* \* \* \*